United States Patent
Schwager et al.

(10) Patent No.: US 10,228,783 B2
(45) Date of Patent: Mar. 12, 2019

(54) SYSTEM AND METHOD FOR ESD PROTECTION IN A TOUCH SCREEN DISPLAY

(71) Applicant: Dell Products L.P., Round Rock, TX (US)

(72) Inventors: Mark Schwager, Cedar Park, TX (US); Jason I. Lee, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 98 days.

(21) Appl. No.: 15/228,886

(22) Filed: Aug. 4, 2016

(65) Prior Publication Data

US 2018/0039348 A1    Feb. 8, 2018

(51) Int. Cl.
   G06F 3/041    (2006.01)
   H05K 9/00    (2006.01)
   G06F 3/044    (2006.01)

(52) U.S. Cl.
   CPC ........... *G06F 3/041* (2013.01); *H05K 9/0067* (2013.01); *G06F 3/044* (2013.01); *G06F 2203/04107* (2013.01)

(58) Field of Classification Search
   CPC .......... G06F 3/044; G06F 2203/04107; H05K 9/0067
   See application file for complete search history.

(56) References Cited

U.S. PATENT DOCUMENTS

| | | | | |
|---|---|---|---|---|
| 2010/0220071 A1* | 9/2010 | Nishihara | ............. | G06F 3/0416 345/173 |
| 2012/0075218 A1* | 3/2012 | Lin | ........................ | G06F 3/0418 345/173 |
| 2012/0087065 A1* | 4/2012 | Kim | ........................ | G06F 1/1656 361/679.01 |
| 2014/0022191 A1* | 1/2014 | Yun | ........................ | G06F 3/041 345/173 |
| 2014/0028582 A1* | 1/2014 | Choi | ........................ | G06F 3/041 345/173 |
| 2017/0090652 A1* | 3/2017 | Sato | ........................ | G06F 3/0416 |

* cited by examiner

Primary Examiner — Lixi C Simpson
(74) Attorney, Agent, or Firm — Baker Botts L.L.P.

(57) ABSTRACT

System and methods for ESD protection in a touch screen display are disclosed. A touch screen display for an Information Handling System (IHS) include a coverglass, an ESD ground ring on the coverglass; and a touch panel proximate to the coverglass. An information handling system includes a display housing including a bezel adapted to retain a plurality of display components; the plurality of display components including a coverglass, an ESD ground ring on the coverglass; and a touch panel proximate to the coverglass. Methods are also disclosed.

11 Claims, 4 Drawing Sheets

SYSTEM AND METHOD FOR ESD PROTECTION IN A TOUCH SCREEN DISPLAY

TECHNICAL FIELD

This disclosure relates generally to information handling systems and, more particularly, to a system and method for electrostatic discharge protection in a touch screen display.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more information handling systems, data storage systems, and networking systems.

SUMMARY

In some embodiments, a touch screen display for an Information Handling System (IHS) is disclosed. The IHS includes a coverglass, an ESD ground ring on the coverglass, and a touch panel proximate to the coverglass.

In another embodiments, an information handling system is disclosed. The information handling system includes a display housing including a bezel adapted to retain a plurality of display components, the plurality of display components including a coverglass, an ESD ground ring on the coverglass, and a touch panel proximate to the coverglass.

In a further embodiment, a method of manufacturing a touch panel display is disclosed. The method includes depositing an ESD ground ring on a coverglass, and affixing the coverglass to a touch panel.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION

In the following description, details are set forth by way of example to facilitate discussion of the disclosed subject matter. It should be apparent to a person of ordinary skill in the field, however, that the disclosed embodiments are exemplary and not exhaustive of all possible embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, entertainment, or other purposes. For example, an information handling system may be a personal computer (e.g., desktop or laptop), tablet computer, mobile device (e.g., personal digital assistant (PDA) or smart phone), server (e.g., blade server or rack server), a consumer electronic device, a network storage device, or another suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. Additional components of the information handling system may include one or more disk drives, one or more storage devices, one or more communications ports (e.g., network ports) for communicating with external devices as well as various input and output (I/O) devices, such as a keyboard, a mouse, a touchscreen and/or a video display. The information handling system may also include one or more buses operable to transmit communication between the various hardware components.

Herein, a computer-readable non-transitory storage medium or media may include one or more semiconductor-based or other integrated circuits (ICs) (such as, for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Particular embodiments are best understood by reference to the following figures, wherein like numbers are used to indicate like and corresponding parts.

Figure 1:
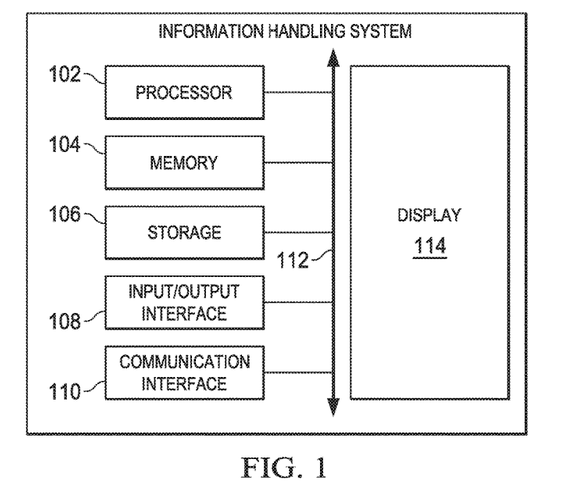
FIG. 1 illustrates a block diagram of selected elements of an embodiment of an information handling system, in accordance with some embodiments of the present disclosure.

FIG. 1 is a block diagram of selected elements of an embodiment of information handling system 100, in accordance with some embodiments of the present disclosure. In particular embodiments, one or more information handling systems 100 perform one or more steps of one or more methods described or illustrated herein. In particular embodiments, one or more information handling systems 100 provide the functionality described or illustrated herein. In particular embodiments, software running on one or more information handling systems 100 performs one or more steps of one or more methods described or illustrated herein or provides functionality described or illustrated herein. Particular embodiments include one or more portions of one or more information handling systems 100. Herein, reference to an information handling system may encompass a computing device, and vice versa, where appropriate. Moreover, reference to an information handling system may encompass one or more information handling systems, where appropriate.

This disclosure contemplates any suitable number of information handling systems 100. This disclosure contemplates information handling system 100 taking any suitable physical form. As an example and not by way of limitation, information handling system 100 may be an embedded information handling system, a system-on-chip (SOC), a single-board information handling system (SBC) (such as, for example, a computer-on-module (COM) or system-on-module (SOM)), a desktop information handling system, a laptop or notebook information handling system, an interactive kiosk, a mainframe, a mesh of information handling systems, a mobile telephone, a personal digital assistant (PDA), a server, a tablet information handling system, or a combination of two or more of these. Where appropriate, information handling system 100 may include one or more information handling systems 100, be unitary or distributed, span multiple locations, span multiple machines, span multiple data centers, or reside in a cloud, which may include one or more cloud components in one or more networks. Where appropriate, one or more information handling systems 100 may perform without substantial spatial or temporal limitation one or more steps of one or more methods described or illustrated herein. As an example and not by way of limitation, one or more information handling systems 100 may perform in real time or in batch mode one or more steps of one or more methods described or illustrated herein. One or more information handling systems 100 may perform at different times or at different locations one or more steps of one or more methods described or illustrated herein, where appropriate.

In particular embodiments, information handling system 100 includes processor 102, memory 104, storage 106, input/output (I/O) interface 108, communication interface 110, and bus 112. Although this disclosure describes and illustrates a particular information handling system having a particular number of particular components in a particular arrangement, this disclosure contemplates any suitable information handling system having any suitable number of any suitable components in any suitable arrangement.

In particular embodiments, processor 102 includes hardware for executing instructions, such as those making up a computer program. As an example and not by way of limitation, to execute instructions, processor 102 may retrieve (or fetch) the instructions from an internal register, an internal cache, memory 104, or storage 106; decode and execute them; and then write one or more results to an internal register, an internal cache, memory 104, or storage 106. In particular embodiments, processor 102 may include one or more internal caches for data, instructions, or addresses. This disclosure contemplates processor 102 including any suitable number of any suitable internal caches, where appropriate. As an example and not by way of limitation, processor 102 may include one or more instruction caches, one or more data caches, and one or more translation look aside buffers (TLBs). Instructions in the instruction caches may be copies of instructions in memory 104 or storage 106, and the instruction caches may speed up retrieval of those instructions by processor 102. Data in the data caches may be copies of data in memory 104 or storage 106 for instructions executing at processor 102 to operate on; the results of previous instructions executed at processor 102 for access by subsequent instructions executing at processor 102 or for writing to memory 104 or storage 106; or other suitable data. The data caches may speed up read or write operations by processor 102. The TLBs may speed up virtual-address translation for processor 102. In particular embodiments, processor 102 may include one or more internal registers for data, instructions, or addresses. This disclosure contemplates processor 102 including any suitable number of any suitable internal registers, where appropriate. Where appropriate, processor 102 may include one or more arithmetic logic units (ALUs); be a multi-core processor; or include one or more processors 102. Although this disclosure describes and illustrates a particular processor, this disclosure contemplates any suitable processor.

In particular embodiments, memory 104 includes main memory for storing instructions for processor 102 to execute or data for processor 102 to operate on. As an example and not by way of limitation, information handling system 100 may load instructions from storage 106 or another source (such as, for example, another information handling system 100) to memory 104. Processor 102 may then load the instructions from memory 104 to an internal register or internal cache. To execute the instructions, processor 102 may retrieve the instructions from the internal register or internal cache and decode them. During or after execution of the instructions, processor 102 may write one or more results (which may be intermediate or final results) to the internal register or internal cache. Processor 102 may then write one or more of those results to memory 104. In particular embodiments, processor 102 executes only instructions in one or more internal registers or internal caches or in memory 104 (as opposed to storage 106 or elsewhere) and operates only on data in one or more internal registers or internal caches or in memory 104 (as opposed to storage 106 or elsewhere). One or more memory buses (which may each include an address bus and a data bus) may couple processor 102 to memory 104. Bus 112 may include one or more memory buses, as described below. In particular embodiments, one or more memory management units (MMUs) reside between processor 102 and memory 104 and facilitate access to memory 104 requested by processor 102. In particular embodiments, memory 104 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 104 may include one or more memories 104, where appropriate. Although this disclosure describes and illustrates particular memory, this disclosure contemplates any suitable memory.

In particular embodiments, storage 106 includes mass storage for data or instructions. As an example and not by way of limitation, storage 106 may include a hard disk drive (HDD), a floppy disk drive, flash memory, an optical disc, a magneto-optical disc, magnetic tape, or a Universal Serial Bus (USB) drive or a combination of two or more of these. Storage 106 may include removable or non-removable (or fixed) media, where appropriate. Storage 106 may be internal or external to information handling system 100, where appropriate. In particular embodiments, storage 106 is non-volatile, solid-state memory. In particular embodiments, storage 106 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 106 taking any suitable physical form. Storage 106 may include one or more storage control units facilitating communication between processor 102 and storage 106, where appropriate. Where appropriate, storage 106 may include one or more storages 106. Although this disclosure describes and illustrates particular storage, this disclosure contemplates any suitable storage.

In particular embodiments, I/O interface 108 includes hardware, software, or both, providing one or more interfaces for communication between information handling system 100 and one or more I/O devices. Information handling system 100 may include one or more of these I/O devices, where appropriate. One or more of these I/O devices may enable communication between a person and information handling system 100. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 108 for them. Where appropriate, I/O interface 108 may include one or more device or software drivers enabling processor 102 to drive one or more of these I/O devices. I/O interface 108 may include one or more I/O interfaces 108, where appropriate. Although this disclosure describes and illustrates a particular I/O interface, this disclosure contemplates any suitable I/O interface.

In particular embodiments, communication interface 110 includes hardware, software, or both providing one or more interfaces for communication (such as, for example, packet-based communication) between information handling system 100 and one or more other information handling systems 100 or one or more networks. As an example and not by way of limitation, communication interface 110 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 110 for it. As an example and not by way of limitation, information handling system 100 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, information handling system 100 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Information handling system 100 may include any suitable communication interface 110 for any of these networks, where appropriate. Communication interface 110 may include one or more communication interfaces 110, where appropriate. Although this disclosure describes and illustrates a particular communication interface, this disclosure contemplates any suitable communication interface.

In particular embodiments, bus 112 includes hardware, software, or both coupling components of information handling system 100 to each other. As an example and not by way of limitation, bus 112 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 112 may include one or more buses 112, where appropriate. Although this disclosure describes and illustrates a particular bus, this disclosure contemplates any suitable bus or I/O interconnect.

In particular embodiments, information handling system 100 may be a wireless-enabled, portable device that may include one or more processors 102 (e.g., dual core ARM processors), volatile memory 104 (e.g., RAM), non-volatile memory 104 (e.g., flash memory), input/output interfaces 108 (e.g., for display, for data, and for audio), networking/communications interfaces 110, and one or more operating systems (e.g., stored in memory 104 and operated on by processors 102). The input/output interfaces 108 may include display interfaces that support one or more of the Mobile High-Definition Link (MHL) standard, the High Definition Multimedia Interface (HDMI) standard, or the Display Port (DP) standard. The input/output interfaces 108 may also include one or more USB ports (e.g., standard, mini or micro USB), one or more removable memory slots (e.g., SD card slots), and audio capabilities through the MHL, HDMI, or DP interfaces. Information handling system 100 may include networking or communication interfaces 110 that support IEEE 802.11 WLAN protocols (including a, b, g, n, or ac), single or dual band WiFi, BLUETOOTH communication, and near field communication (NFC). Information handling system 100 may include one or more operating systems, including versions of Android, Windows, Wyse ThinOS, Linux, or Apple iOS. Information handling system 100 may include one or more native applications, including, for example, a browser, a media player and recorder, voice over IP and video communication software, and software for remote access to cloud services or other remote content or services.

Information handling system 100 may include display 114. Display 114 may be electrically coupled to information handling system 100 with a cable, wireless, or using any suitable electrical interconnection between display 114 and information handling system 100. Display 114 may be physically coupled to information handling system 100 or may be remote from information handling system 100. For example, in some embodiments, display 114 may be integrally formed with information handling system 100. In some embodiments, display 114 may be coupled to information handling system 100 with a hinge. In further embodiments, display 114 may be remote from information handling system 100. In yet further embodiments, components of information handling system 100 may be distributed between multiple physical housings, including, for example, a housing of display 114.

Display 114 may be a touch screen display. A touch screen display may require protection from electrostatic discharge (ESD). ESD may include undesirable electrical discharges from any source. For example, ESD may include discharges of static electricity from a human body. Without ESD protection, ESD may damage display 114. Accordingly, ESD protection may be used to safely route ESD away from vulnerable electronics to a safe destination. For example, ESD protection may route ESD to an electrical ground of display 114 or an electrical ground of information handling system 100. In some embodiments, ESD protection may include one or more conductive grounds rings that surround a border of display 114. These conductive grounds rings may operate to conduct ESD safely to electrical ground without damaging electrically sensitive components in display 114.

Figure 2:
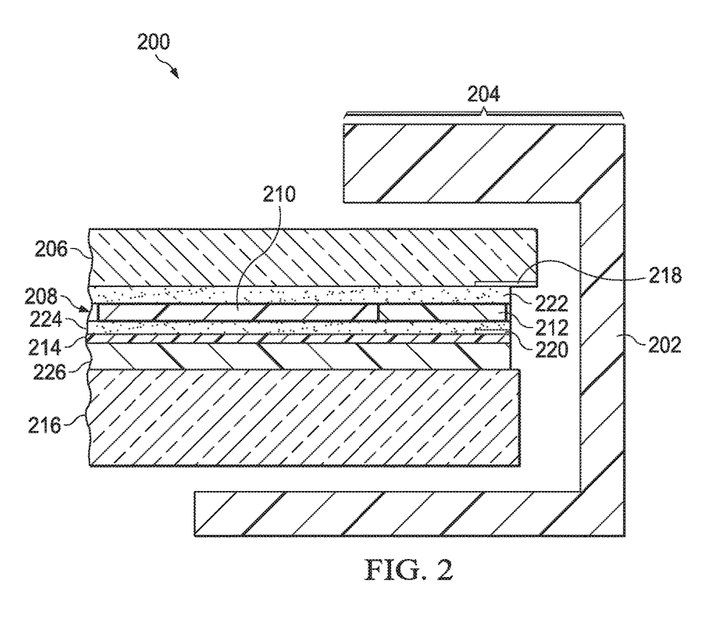
FIG. 2 illustrates an example cross section of a display, in accordance with embodiments of the present disclosure.

FIG. 2 illustrates an example cross section of display 200, in accordance with embodiments of the present disclosure. Display 200 is one example of display 114 of FIG. 1. In some embodiments, display 200 may include housing 202. Housing 202 may be formed from plastic, metals such as aluminum, or any other suitable housing material. Housing 202 may include bezel 204. Bezel 204 may include a portion of housing 202 that extends inwardly toward a center of display 200. Bezel 204 may overhang other components of display 200, and operate to retain those components within housing 202 and/or to prevent an edge of those components from being visible to a user.

For example, bezel 204 may retain coverglass 206 within housing 202. Coverglass 206 may be a topmost physical layer of a touch screen. Coverglass 206 may be formed from glass, polymethylmethacrylate, or any suitable coverglass material. Coverglass 206 may include coatings (such as oleophobic or hydrophobic coatings), decorative ink, and/or holes for components (such as cameras, microphones, data interfaces, or other components).

Bezel 202 may further retain touch panel 208 within housing 202. In some embodiments, touch panel 208 may be a film based panel, such as a metal mesh panel. Touch panel 208 may operate to sense locations on display 200 that have been touched. Touch panel 208 may include active sensor portion 210 and trace routing portion 212. Active sensor portion 210 may include a portion of touch panel 208 that overlaps with an active area of display 200. Trace routing portion 212 may include a portion of touch panel 208 where signal traces used to transmit touch data are routed.

Touch panel 208 may be coupled to coverglass 206 using an adhesive 222, such as silicone gel, a urethane, or any other suitable adhesive. An adhesive 222 may be inserted between coverglass 206 and touch panel 208, and may fill any gap between coverglass 206 and touch panel 208. An adhesive 222 may be cured to affix coverglass 206 and touch panel 208 together while solidifying the adhesive 222.

Bezel 204 may further retain protection layer 214. Protection layer 214 may be composed of polyethylene terephthalate (PET), or any other suitable protection layer material. Protection layer 214 may be coupled to touch panel 208 using an adhesive 224, such as include silicone gel, a urethane, or any other suitable adhesive. An adhesive 224 may be inserted between touch panel 208 and protection layer 214, and may fill any gap between touch panel 208 and protection layer 214. An adhesive 224 may be cured to affix touch panel 208 and protection layer 214 together while solidifying the adhesive 224.

Bezel 204 may additionally retain display element 216. Display element 216 may include a light source to optically display information on display 200. For example, display element 216 may be a liquid crystal display or an LED display, or may be any other suitable type of display element. Protection layer 214 may be affixed to display element 216 during manufacturing to prevent damage to display element 216.

A narrower bezel may be desirable for certain information handling systems, for aesthetic or other reasons. In order to reduce a width of a bezel, a width of trace routing portion 212 may also need to be reduced because it is often undesirable for the user to see routing portion 212. However, manufactures of touch panels may not be able to make a corresponding reduction in a width of trace routing portion 212. In embodiments where touch panel 208 is a film based panel (such as a metal mesh panel), signaling traces and an ESD ground ring may be formed integrally with a film based panel.

Typically, in a film based panel (such as a metal mesh), an ESD ground ring is integrally formed with the film layer and is located in the trace routing portion. ESD ground rings may surround an outer border of a display, and may be formed from a conductive material. ESD ground rings may be electrically coupled to an electrical ground of an information handling system. In the event of an ESD event, an ESD ground ring may be the path of least resistance ground. Accordingly, any discharged electricity will be conducted via an ESD ground ring to electrical ground, and will not be transmitted to or through electrically sensitive system components. Because an ESD event may be at a high voltage or high current, an ESD ground ring may be designed to be large so that the discharged electricity may be conducted to ground without damaging the ESD ground ring. A width of trace routing portion may therefore depend on a minimum achievable feature pitch for signal traces and an ESD ground ring within trace routing portion 212.

According to embodiments of the present disclosure, ESD ground ring 218 may be located on coverglass 206 rather than integrally formed with touch panel 208. For example, prior to affixing touch panel 208 to coverglass 206, ESD ground ring 218 may be deposited on coverglass 206. Because ESD ground ring 218 may be on a component of display 202 other than touch panel 208, ESD ground ring 218 may partially overlap other traces in trace routing portion 212 of touch panel 208. Accordingly, a width of trace routing portion 212 may be reduced as compared to information handling systems where an ESD ground ring is integrally formed with a touch panel.

According to embodiments of the present disclosure, a second ESD ground ring 220 may be located on protection layer 214 rather than integrally formed with touch panel 208. Second ESD ground ring 220 may provide enhanced ESD protection and reliability. For example, if a first ESD ground ring cease to function, a second ESD ground ring may still provide ESD protection. In some embodiments, prior to affixing touch panel 208 to protection layer 214, second ESD ground ring 220 may be deposited on protection layer 214. Because ESD ground ring 220 may be on a different component of display 202, ESD ground ring 220 may partially overlap other traces in trace routing portion 212. Accordingly, a width of trace routing portion 212 may be reduced as compared to an trace routing portion of a touch panel where an ESD ground ring is integrally formed with the touch panel.

Figure 3A:
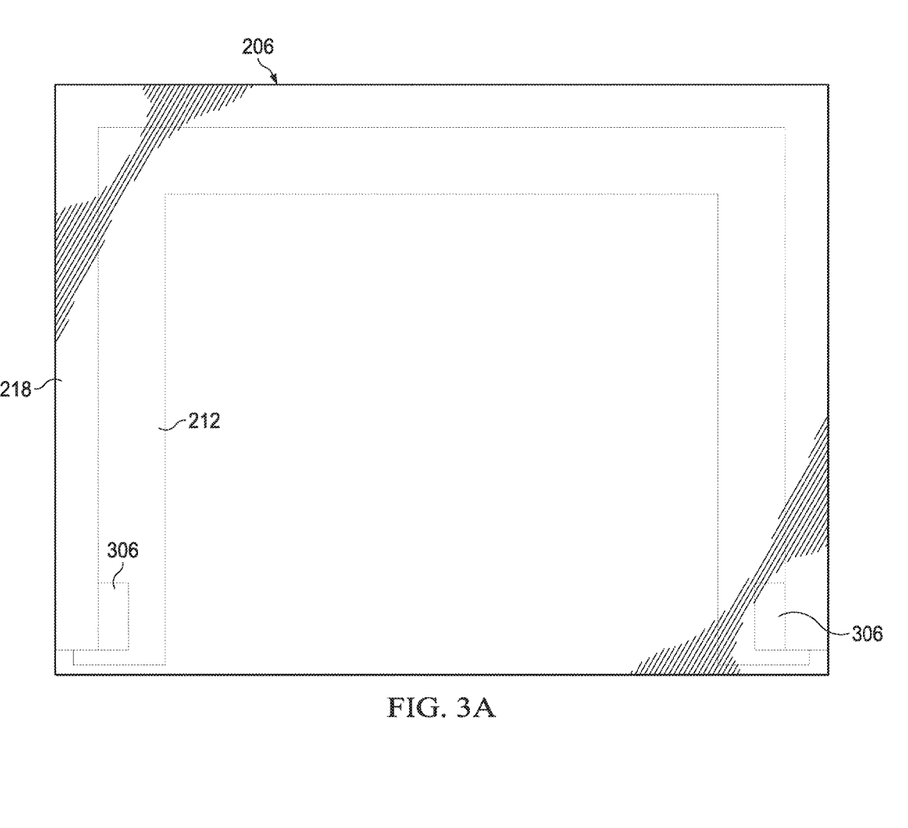
FIG. 3A illustrates a front view of a coverglass including an ESD ground ring, in accordance with some embodiments of the present disclosure.

FIG. 3A illustrates a front view of a coverglass layer including an ESD ground ring, in accordance with some embodiments of the present disclosure. Coverglass 206 is discussed in further detail above with reference to FIG. 2. ESD ground ring 218 may partially surround a border of coverglass 206. For example, ESD ground ring 218 may border three of the four sides of a rectangular coverglass 206. In additional embodiments, ESD ground ring 218 may full surround a perimeter of coverglass 206. For reference, exemplary locations of trace routing portion 212 is illustrated. As explained above, signaling traces may typically be located on a touch panel. However, when a touch panel is affixed to coverglass 206 as shown in FIG. 2, trace routing portion 212 may be aligned in the exemplary location illustrated in FIG. 3A. FIG. 3A therefore illustrates that ESD ground ring 218 may partially overlap locations where trace routing portion 212 is aligned on coverglass 206. This would not be possible if ESD ground ring 218 were on a touch panel rather than coverglass 206.

ESD ground ring 218 may include one or more grounding points 306. Grounding points 306 may include locations where ESD ground ring 218 is connected to an electrical ground of an IHS. In embodiments where coverglass 206 may be used in a display of an information handling system such as a laptop, ESD ground ring 218 may include two grounding points 306. For example, ESD ground ring 218 may include a grounding point at each corner of a clamshell housing proximate to a hinge. Grounding points 306 may be electrically connected to a system ground of an information handling system.

ESD ground ring 218 may be composed of any suitable conducting material, such as silver ink. ESD ground ring 218 may be deposited by any suitable deposition process, such as chemical vapor deposition, physical vapor deposition, evaporation, sputtering or printing.

Figure 3B:
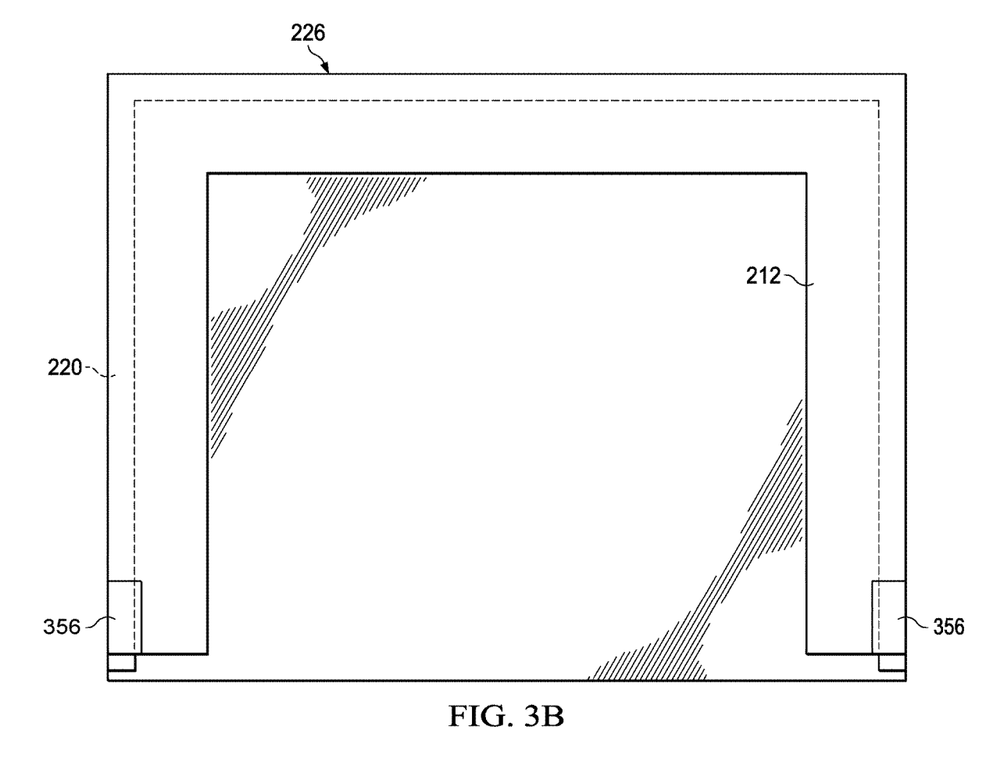
FIG. 3B illustrates a front view of a protection layer including an ESD ground ring, in accordance with some embodiments of the present disclosure.

FIG. 3B illustrates a front view of a protection layer including an ESD ground ring, in accordance with some embodiments of the present disclosure. Protection layer 226 may have similar features as protection layer 214, discussed above with reference to FIG. 2. ESD ground ring 220 may partially surround a border of protection layer 226. For example, ESD ground ring 220 may border three of the four sides of a rectangular protection layer 226. In additional embodiments, ESD ground ring 220 may full surround a perimeter of protection layer 226. For reference, exemplary locations of trace routing portion 212 is illustrated. As explained above, signaling traces may be located on a touch panel. However, when a touch panel is affixed to protection layer 226, trace routing portion 212 may be aligned in the exemplary location illustrated in FIG. 3B. FIG. 3B therefore illustrates that ESD ground ring 220 may partially overlap locations where trace routing portion 212 would be aligned on protection layer 226. This would not be possible if ESD ground ring 220 were on a touch panel rather than protection layer 226.

ESD ground ring 220 may include one or more grounding points 356. Grounding points 356 may include locations where ESD ground ring 220 is connected to an electrical ground of an IHS. In embodiments where protection ring 226 may be used in a display of an information handling system such as a laptop, ESD ground ring 220 may include two grounding points 356. For example, ESD ground ring 220 may include a grounding point at each corner of a clamshell housing proximate to a hinge. Grounding points 356 may be electrically connected to a system ground of an information handling system.

ESD ground ring 220 may be composed of any suitable conducting material, such as silver ink. ESD ground ring 220 may be deposited by any suitable deposition process, such as chemical vapor deposition, physical vapor deposition, evaporation, sputtering or printing.

Figure 4:
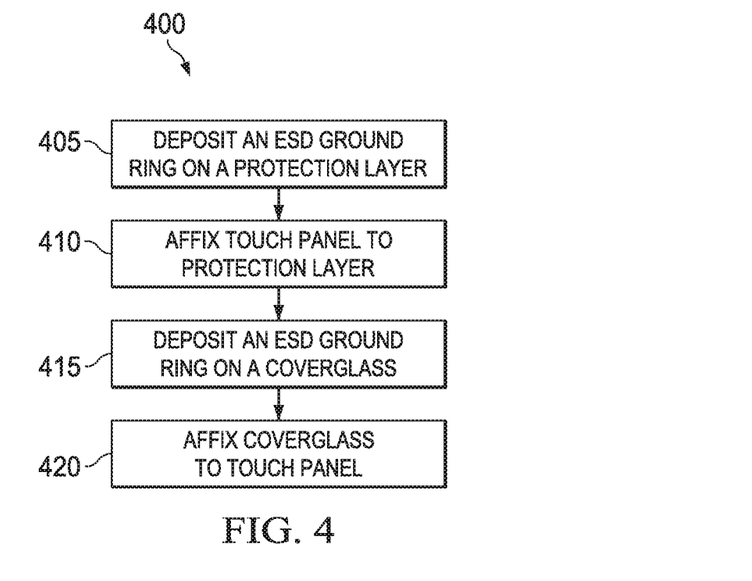
FIG. 4 illustrates an example method for manufacturing a touch screen display, in accordance with some embodiments of the present disclosure.

FIG. 4 illustrates an example method 400 for manufacturing a touch screen display, in accordance with some embodiments of the present disclosure. Method 400 illustrates that embodiments of the present disclosure run counter to conventional wisdom in the industry. Specifically, in touch screens where an ESD ground ring is integrally formed with a touch panel, there is no need to deposit further ground rings. By moving an ESD ground ring to another component, additional manufacturing steps are introduced into method 400, which many increase a cost to produce a display. Typically, it is desirable to use less complex and less expensive manufacturing processes. Here, however, the steps of method 400 yield an unexpected benefit of allowing a narrower bezel, and therefore a more compact display.

Method 400 may begin at 405, where an ESD ground ring may be deposited on a protection layer. A protection layer may be composed of PET or any other suitable protection layer material. A protection layer may be affixed to a display element during manufacturing to prevent damage to a display element. An ESD ground ring may be composed of any suitable conducting material, such as silver ink. ESD ground ring may be deposited by any suitable deposition process, such as chemical vapor deposition, physical vapor deposition, evaporation, sputtering or printing.

A protection layer may be coupled to a touch panel using an adhesive, such as silicone gel, a urethane, or any other suitable adhesive. An adhesive may be inserted between a touch panel and a protection layer, and may fill any gap between a touch panel and a protection layer. An adhesive may be cured to affix a touch panel and a protection layer together while solidifying the adhesive. A display element may include a light source to optically display information on a display. For example, a display element may be a liquid crystal display or an LED display, or may be any other suitable type of display element.

At 410, a touch panel may be affixed to a protection layer. A touch panel may operate to sense locations on a display that have been touched. A touch panel may be a film based panel, such as metal mesh panel, or any other suitable touch panel architecture. A touch panel may include an active sensor portion and a trace routing portion. A active sensor portion may include a portion of a touch panel that overlaps with an active area of display. A trace routing portion may include a portion of a touch panel where signal traces used to transmit touch data are routed.

A touch panel may be coupled to a protection layer using an adhesive, such as silicone gel, a urethane, or any other suitable adhesive. An adhesive may be inserted between a protection layer and a touch panel, and may fill any gap a protection layer and a touch panel. An adhesive may be cured to affix a protection layer and a touch panel together while solidifying the adhesive.

At 415, an ESD ground ring may be deposited on a coverglass. A coverglass may be a topmost physical layer of a touch screen. A coverglass may be formed from glass, polymethylmethacrylate, or any suitable coverglass material. A coverglass may include coatings (such as oleophobic, or hydrophobic coatings), decorative ink, and/or holes for components (such as cameras, microphones, data interfaces, or other components). An ESD ground ring may be composed of any suitable conducting material, such as silver ink. ESD ground ring may be deposited by any suitable deposition process, such as chemical vapor deposition, physical vapor deposition, evaporation, sputtering or printing.

At 420, a coverglass may be affixed to a touch panel. A coverglass may be coupled to a touch panel using an adhesive, such as silicone gel, a urethane, or any other suitable adhesive. An adhesive may be inserted between a touch panel and a coverglass, and may fill any gap between a touch panel and a coverglass. An adhesive may be cured to affix a touch panel and a coverglass together while solidifying the adhesive.

Particular embodiments may repeat one or more steps of the methods of FIG. 4, where appropriate. Although this disclosure describes and illustrates particular steps of the methods of FIG. 4 as occurring in a particular order, this disclosure contemplates any suitable steps of the methods of FIG. 4 occurring in any suitable order. Moreover, although this disclosure describes and illustrates example methods including the particular steps of the methods of FIG. 4, this disclosure contemplates any suitable method for performing the functionality described above which may include all, some, or none of the steps of the methods of FIG. 4 where appropriate. Furthermore, although this disclosure describes and illustrates particular components, devices, or systems carrying out particular steps of the methods of FIG. 4, this disclosure contemplates any suitable combination of any suitable components, devices, or systems carrying out any suitable steps of the methods of FIG. 4.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A touch screen display for an Information Handling System (IHS), comprising:
   a coverglass;
   an ESD ground ring on the coverglass;
   a touch panel proximate to the coverglass, the touch panel including a trace routing portion;
   a protection layer proximate the touch panel and separate from the touch panel; and
   a second ESD ground ring on the protection layer and separate from the touch panel;
   wherein the ESD ground ring is positioned within an area of the coverglass that overlaps the trace routing portion and wherein the second ESD ground ring is positioned within a portion of the protection layer that overlaps the trace routing portion.

2. The touch screen display of claim 1, wherein the touch panel is a metal mesh film-based sensor.

3. The touch screen display of claim 1, further comprising:
   a bezel surrounding and partially overlapping the coverglass;
   wherein the, ESD ground ring is within the area of the coverglass that is overlapped by the bezel.

4. The touch screen display of claim 1, wherein the ESD ground ring comprises silver ink.

5. An information handling system comprising:
   a display housing including a bezel adapted to retain a plurality of display components; the plurality of display components including:
   a coverglass;
   an ESD ground ring on the coverglass;
   a touch panel proximate to the coverglass, the touch panel including a trace routing portion;
   a protection layer proximate to the touch panel and separate from the touch panel; and
   a second ESD ground ring on the protection layer and separate from the touch panel;
   wherein the ESD ground ring is positioned within an area of the coverglass that overlaps the trace routing portion and wherein the second ESD ground ring is positioned within a portion of the protection layer that overlaps the trace routing portion.

6. The information handling system of claim 5, wherein the touch panel is a metal mesh film-based sensor.

7. The information handling system of claim 5, wherein the ESD ground ring is within an area of the coverglass that is overlapped by the bezel.

8. The information handling system of claim 5, wherein:
   the touch panel includes a trace routing portion; and
   wherein the ESD ground ring is within an area of the coverglass that overlaps the trace routing portion.

9. A method of manufacturing a touch panel display comprising:
   depositing an ESD ground ring on a coverglass;
   affixing the coverglass to a touch panel, the touch panel including a trace routing portion;
   depositing a second ESD ground ring on a protection layer affixed to a display element, wherein the second ESD ground ring is separate from the touch panel; and
   affixing the touch panel to the protection layer, wherein the protection layer is separate from the touch panel;
   wherein the ESD ground ring is deposited within an area of the coverglass that overlaps the trace routing portion and wherein the second ESD ground ring is deposited within a portion of the protection layer that overlaps the trace routing portion.

10. The method of claim 9, wherein the touch panel is a metal mesh film-based sensor.

11. The method of claim 9, wherein the ESD ground ring comprises silver ink.

* * * * *